(12) United States Patent
Lastras-Montano et al.

(10) Patent No.: US 8,166,368 B2
(45) Date of Patent: Apr. 24, 2012

(54) WRITING A SPECIAL SYMBOL TO A MEMORY TO INDICATE THE ABSENCE OF A DATA SIGNAL

(75) Inventors: Luis A. Lastras-Montano, Cortlandt Manor, NY (US); John P. Karidis, Ossining, NY (US); Stefanie R. Chiras, Peekskill, NY (US); Mayank Sharma, White Plains, NY (US); Thomas Mittelholzer, Zurich (CH); Michele M. Franceschini, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 672 days.

(21) Appl. No.: 12/391,678

(22) Filed: Feb. 24, 2009

(65) Prior Publication Data

US 2010/0218071 A1     Aug. 26, 2010

(51) Int. Cl.
*G06F 11/00* (2006.01)
(52) U.S. Cl. ........................................ 714/763
(58) Field of Classification Search .......... 714/763–768, 714/772–774, 780, 805, 819, 822
See application file for complete search history.

(56) References Cited

U.S. PATENT DOCUMENTS

| | | | |
|---|---|---|---|
| 5,502,728 A * | 3/1996 | Smith, III | 714/5.11 |
| 5,623,436 A | 4/1997 | Sowards et al. | |
| 5,751,993 A | 5/1998 | Ofek et al. | |
| 5,818,755 A | 10/1998 | Koyanagi et al. | |
| 5,867,429 A | 2/1999 | Chen et al. | |
| 5,912,839 A | 6/1999 | Ovshinsky et al. | |
| 5,987,570 A | 11/1999 | Hayes et al. | |
| 6,009,547 A | 12/1999 | Jaquette et al. | |
| 6,040,993 A | 3/2000 | Chen et al. | |
| 6,076,183 A | 6/2000 | Espie et al. | |
| 6,222,762 B1 | 4/2001 | Guterman et al. | |

(Continued)

FOREIGN PATENT DOCUMENTS

WO    WO2006064497 A2    6/2006

OTHER PUBLICATIONS

G. Novark et al.; "Exterminator: Automatically Correcting Memory Errors with High Probability", PLDI'07; Jun. 11-13, 2007; San Diego, CA; Copyright 2007; 11 pages.

(Continued)

*Primary Examiner* — Nadeem Iqbal
(74) *Attorney, Agent, or Firm* — Cantor Colburn LLP; Brian Verminski

(57) ABSTRACT

A method for writing in a memory system that includes receiving an address corresponding to a memory location in a memory, receiving a desired content to be written, encoding the desired content into a symbol, and writing the symbol to the memory location using an iterative write process of at least one write and one read to the memory location. The iterative write process includes determining if the symbol was successfully written to the memory location and exiting the iterative write process in response to the symbol being successfully written to the memory location. The iterative write process also includes determining if a halt condition has been met and exiting the iterative write process if the halt condition has been met. Once the iterative write process has been exited, the memory location may be identified as a candidate for being written with a special symbol.

20 Claims, 7 Drawing Sheets

U.S. PATENT DOCUMENTS

| | | | |
|---|---|---|---|
| 6,292,398 B1 | 9/2001 | Pasotti et al. |
| 6,292,903 B1 | 9/2001 | Coteus et al. |
| 6,301,151 B1 | 10/2001 | Engh et al. |
| 6,397,366 B1 | 5/2002 | Tanaka et al. |
| 6,415,363 B1 | 7/2002 | Benayoun et al. |
| 6,424,566 B1 | 7/2002 | Parker |
| 6,457,174 B1 | 9/2002 | Kuroda et al. |
| 6,473,879 B1 | 10/2002 | Ishii et al. |
| 6,522,580 B2 | 2/2003 | Chen et al. |
| 6,570,784 B2 | 5/2003 | Lowrey |
| 6,728,826 B2 | 4/2004 | Kaki et al. |
| 6,748,561 B2* | 6/2004 | Prasad .......................... 714/702 |
| 6,816,413 B2 | 11/2004 | Tanzawa |
| 6,870,773 B2 | 3/2005 | Noguchi et al. |
| 6,937,522 B2 | 8/2005 | Funaki |
| 6,970,382 B2 | 11/2005 | Toros et al. |
| 7,031,181 B1 | 4/2006 | Nistri et al. |
| 7,073,012 B2 | 7/2006 | Lee |
| 7,103,812 B1 | 9/2006 | Thompson et al. |
| 7,127,004 B1* | 10/2006 | Sonning et al. ............... 375/295 |
| 7,177,199 B2 | 2/2007 | Chen et al. |
| 7,180,771 B2 | 2/2007 | Cho et al. |
| 7,203,886 B2 | 4/2007 | Brown et al. |
| 7,292,466 B2 | 11/2007 | Nirschl |
| 7,301,817 B2 | 11/2007 | Li et al. |
| 7,305,596 B2 | 12/2007 | Noda et al. |
| 7,313,016 B2 | 12/2007 | Dodge et al. |
| 7,327,609 B2 | 2/2008 | Kim et al. |
| 7,352,624 B2 | 4/2008 | Roohparvar |
| 7,352,627 B2 | 4/2008 | Cohen |
| 7,355,237 B2 | 4/2008 | Lutze et al. |
| 7,362,615 B2 | 4/2008 | Pham et al. |
| 7,372,725 B2 | 5/2008 | Philipp et al. |
| 7,391,642 B2 | 6/2008 | Gordon et al. |
| 7,397,698 B2 | 7/2008 | Fong et al. |
| 7,430,639 B1 | 9/2008 | Bali et al. |
| 7,436,703 B2 | 10/2008 | Pham et al. |
| 7,440,315 B2 | 10/2008 | Lung |
| 7,447,948 B2 | 11/2008 | Galbi et al. |
| 7,471,559 B2 | 12/2008 | Shibata |
| 7,480,176 B2 | 1/2009 | Kamei |
| 7,542,336 B2 | 6/2009 | Han |
| 7,606,077 B2 | 10/2009 | Li et al. |
| 2002/0099996 A1 | 7/2002 | Demura et al. |
| 2003/0163776 A1* | 8/2003 | Prasad .......................... 714/752 |
| 2005/0240745 A1 | 10/2005 | Iyer et al. |
| 2005/0251621 A1 | 11/2005 | Theis |
| 2006/0015780 A1 | 1/2006 | Fong |
| 2006/0155791 A1 | 7/2006 | Tene et al. |
| 2006/0179400 A1 | 8/2006 | Qian et al. |
| 2007/0153579 A1 | 7/2007 | Roohparvar et al. |
| 2007/0189065 A1 | 8/2007 | Suh et al. |
| 2008/0010581 A1 | 1/2008 | Alrod et al. |
| 2008/0025080 A1 | 1/2008 | Chan et al. |
| 2008/0034272 A1 | 2/2008 | Wu et al. |
| 2008/0151613 A1 | 6/2008 | Chao et al. |
| 2008/0162858 A1 | 7/2008 | Moyer |
| 2008/0222368 A1 | 9/2008 | Gehrmann |
| 2008/0222491 A1 | 9/2008 | Lee et al. |
| 2008/0266991 A1 | 10/2008 | Lee et al. |
| 2008/0282106 A1 | 11/2008 | Shalvi et al. |
| 2009/0003044 A1 | 1/2009 | Happ et al. |
| 2009/0034324 A1 | 2/2009 | Kim et al. |

OTHER PUBLICATIONS

Ki-Tae Park et al., "A Zeroing Cell-to-Cell Interference Page Architecture with Temporary LSB Storing and Parallel MSB Program Scheme for MLC NAND Flash Memories,"IEEE Journal of Solid-State Circuits, vol. 43, No. 4, Apr. 2008, pp. 919-928.

Noboru Shibata et al., "A 70 nm 16 Gb 1-Level-Cell NAND Flash Memory", IEEEJournal of Solid-State Circuits, vol. 43, No. 4, Apr. 2008, pp. 929-937.

Feng Qin et al., "Exploiting ECC-Memory for Detecting Memory Leaks and Memory Corruption during Production Runs", 11th International Symposium on High-Performance Computer Architecture (HPCA-11 2005) pp. 12.

* cited by examiner

WRITING A SPECIAL SYMBOL TO A MEMORY TO INDICATE THE ABSENCE OF A DATA SIGNAL

BACKGROUND OF THE INVENTION

This disclosure relates generally to computer memory, and more specifically to writing a special symbol to a memory to indicate the absence of a data signal in the memory.

Memory technologies such as flash memory and phase change memory (PCM) benefit from iterative write techniques (commonly referred to as "write-and-verify") which are comprised of a sequence of write and read operations. These techniques allow a controller for the memory to store a desired value with an increased accuracy since the read operations offer a feedback mechanism that can be used to reduce errors in the writing process. Such increased accuracy is particularly important when more than one bit per cell either in flash memory or PCM is desired. One drawback of write-and-verify techniques is that the iterative process consumes additional resources in the memory. For example, the write bandwidth gets reduced in a manner proportional to the number of attempts it takes to store a value in the memory.

BRIEF SUMMARY

Exemplary embodiments include a method for writing in a memory system. The method includes receiving an address corresponding to a memory location in a memory, receiving a desired content to be written to the memory location, encoding the desired content into a symbol to be written to the memory location, and writing the symbol to the memory location using an iterative write process of at least one write and one read to the memory location. The iterative write process includes determining if the symbol was successfully written to the memory location and exiting the iterative write process in response to the symbol being successfully written to the memory location. The iterative write process also includes determining if a halt condition has been met and exiting the iterative write process if the halt condition has been met. Once the iterative write process has been exited, the memory location is identified as a candidate for being written with a special symbol in response to the symbol not being successfully written to the memory location.

Other exemplary embodiments include a memory system. The memory system includes a memory having a memory location and memory access control circuitry connected to the memory location. The memory access control circuitry receives an address corresponding to the memory location via an address bus, receives a desired content to be written to the memory location via a write bus, encodes the desired content into a symbol to be written to the memory location, and writes the symbol to the memory location using an iterative write process of at least one write and one read to the memory location. The iterative write process includes determining if the symbol was successfully written to the memory location and exiting the iterative write process in response to the symbol being successfully written to the memory location. The iterative write process also includes determining if a halt condition has been met and exiting the iterative write process if the halt condition has been met. Once the iterative write process has been exited, the memory location is identified as a candidate for being written with a special symbol in response to the symbol not being successfully written to the memory location.

Further exemplary embodiments include a computer program product for writing in a memory system. The computer program product includes a tangible storage medium readable by a processing circuit and storing instructions for execution by the processing circuit for performing a method. The method includes receiving an address corresponding to a memory location in a memory, receiving a desired content to be written to the memory location, encoding the desired content into a symbol to be written to the memory location, and writing the symbol to the memory location using an iterative write process of at least one write and one read to the memory location. The iterative write process includes determining if the symbol was successfully written to the memory location and exiting the iterative write process in response to the symbol being successfully written to the memory location. The iterative write process also includes determining if a halt condition has been met and exiting the iterative write process if the halt condition has been met. Once the iterative write process has been exited, the memory location is identified as a candidate for being written with a special symbol in response to the symbol not being successfully written to the memory location.

Additional features and advantages are realized through the techniques of the present embodiment. Other embodiments and aspects are described herein and are considered a part of the claimed invention. For a better understanding of the invention with the advantages and features, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Figure 1:
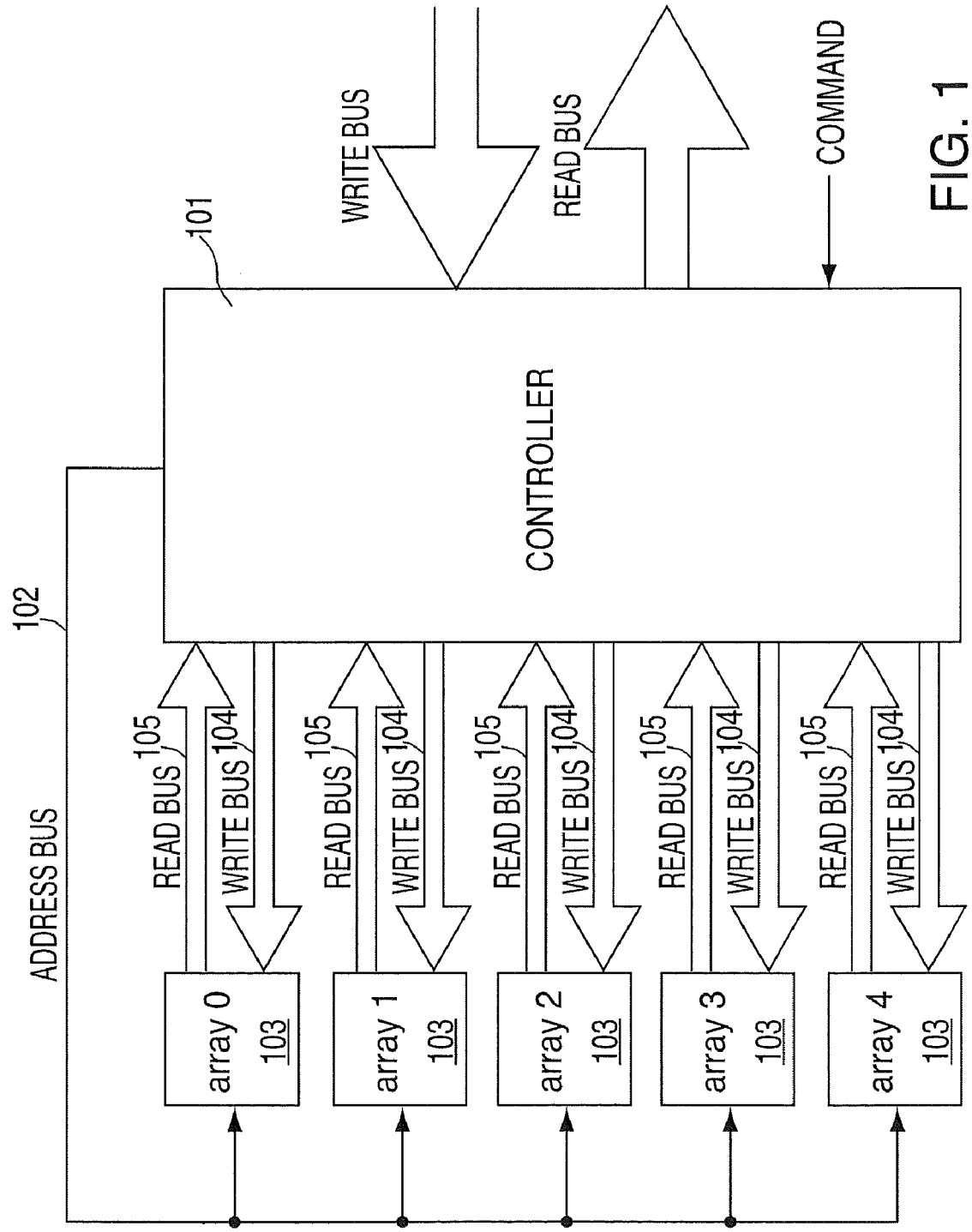
FIG. 1 illustrates a system that may be implemented by exemplary embodiments of the present invention.

An exemplary embodiment of the present invention is directed to writing a special symbol to a memory to indicate the absence of a data symbol in the memory.

Exemplary embodiments of the present invention pertain to low complexity encoding and decoding methods for rewritable memories that are impaired with write noise. During a write procedure, a request is made to write symbols to the memory and those symbols that meet a particular condition, such as, for example, a write error, are then overwritten with a special symbol. During the read procedure, special symbols are properly interpreted according to the condition, for example, as erasures. The presence of a structure in the write procedure, such as the use of an error correction code (ECC)

helps to calculate the missing values substituted by the special symbols and to recover the data written to the memory.

Because the write bandwidth gets reduced in a manner proportional to the number of attempts it takes to store a value in the memory, it is desirable to limit the number of retries in the write procedure. In general, the number of retries to obtain a desired content of the memory location with a desired accuracy, is a random variable. Depending on factors such as, but not limited to, the desired content, the required accuracy for the content to be stored into the memory location, the physical characteristics of the memory location, the average number of required retries, and the variance, statistics relating to the required number of iterations will vary. If the number of iterations (retries) is limited to a given maximum number there is the chance that the write process will reach the last allowed iteration without succeeding in fulfilling the accuracy requirements. However, the memory location is rewritable and this allows a new value to be written on the cell in this case. This value is referred to herein as a "special value." Ideally, this value has the characteristic of having a high probability of being successfully written with a single attempt and of being clearly distinguishable from the other values that can be stored into the memory location.

The use of a special value allows the use of low complexity and efficient techniques for reliably writing complex messages into groups of memory locations. In exemplary embodiments of the present invention, the special symbols are treated as "erasures", i.e., their presence means that the write process was not successful and the memory location does not contain any further information.

Exemplary embodiments of the present invention may be utilized when a message will be encoded in a plurality of memory locations. A memory location can be a single memory cell in a memory technology in which information is stored in arrays of cells (examples include flash memory and PCM). A memory location may also be a group of memory cells that are read and written simultaneously. Examples of groups of memory cells include sections or entire rows in a memory array. Each of the plurality of memory locations where a message is encoded may reside on distinct arrays within a chip or within distinct chips. Also, a memory location may refer to a physical location in a medium that is not structured as an array as is the case in rotating media such as compact discs (CDs) and digital video discs (DVDs).

In exemplary embodiments of the present invention, the special symbol is available because the particular technology supports the ability to have a special content that is reliably written and a number of other possible contents (e.g., thresholds in flash technology, and resistance values in PCM technology) or because a particular value among a set of values that can be stored into a memory location may be isolated. To confer reliability to the selected value for the special symbol adjacent values may not be utilized. The value of the special symbol may be chosen from a plurality of values, and may be selected based on particular technology traits of the memory.

FIG. 1 depicts a system that may be implemented by exemplary embodiments of the present invention. The system includes a memory comprised of a plurality of memory locations grouped into arrays 103 that can operate independently. The system is capable of accessing the memory locations separately either to write them or to read them. In exemplary embodiments, each of the arrays 103 has its own data/command bus (including a read bus 105 and a write bus 104) which is used to communicate the contents read from a memory location within the array 103 to the memory controller 101 or to communicate a content to be written to a memory location within an array 103. In exemplary embodiments, one or more address busses 102 are shared by subsets of the arrays 103 of memory locations. In the embodiment depicted in FIG. 1, the controller 101 is connected to a processor or other device via a write bus, a read bus, and a command bus.

In exemplary embodiments of the present invention, the memory controller 101 is capable of accepting a write command, a corresponding message to be written in the memory and an address identifying a position specifying where to write the contents associated with the message. As used herein the phrase "encoding of the message" refers to the association between memory contents and the message. Similarly, the phrase "encoding the desired content into one or more symbols" refers to converting the desired content (e.g., data bits received by the memory controller) into the memory contents (e.g., the symbols).

In the embodiment depicted in FIG. 1, the common address bus 102 connects the memory controller 101 with all of the arrays 103 and a separate data/command bus, including the read bus 105 and the write bus 104, connects each of the arrays 103 with the memory controller 101.

Figure 2:
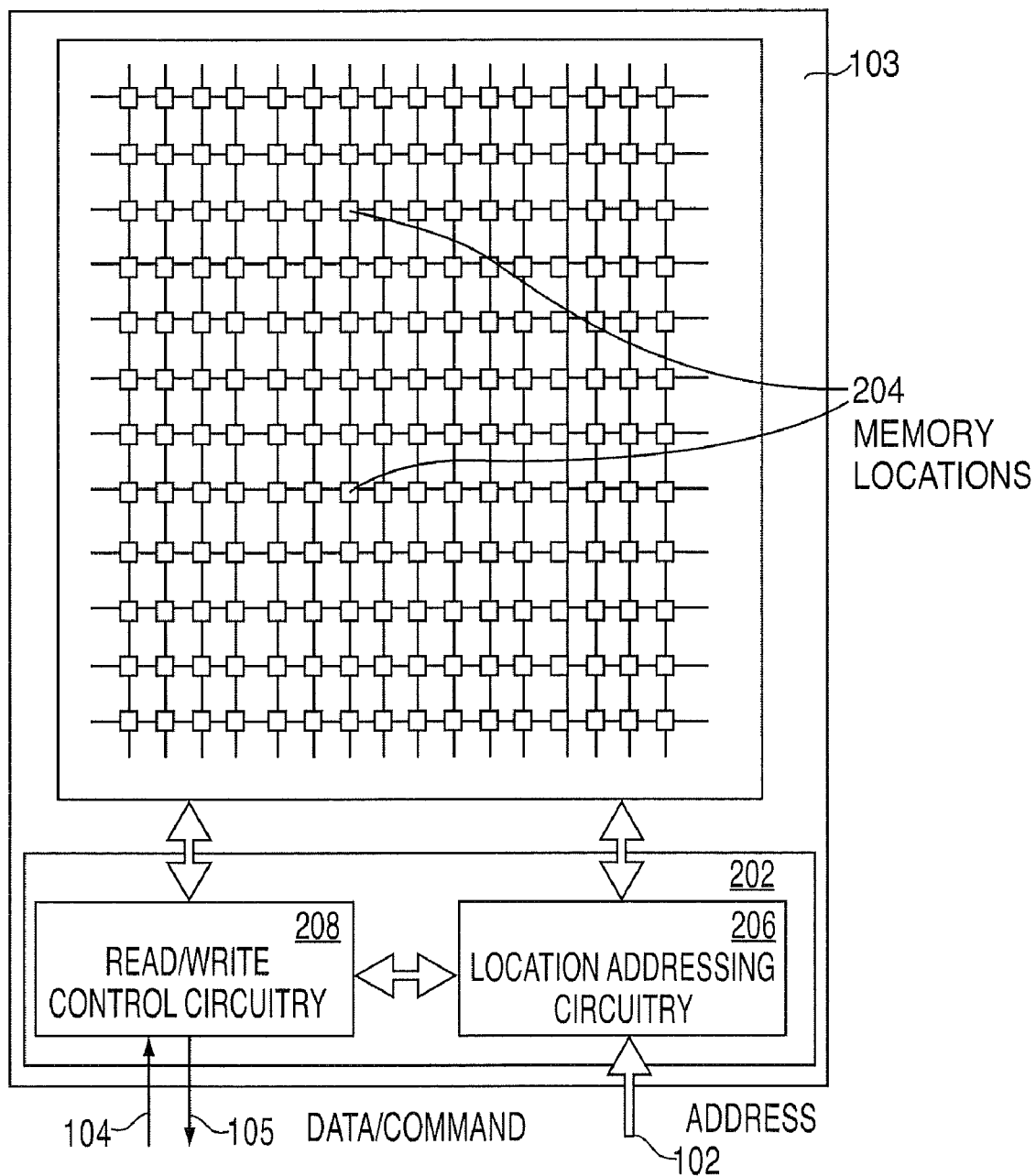
FIG. 2 illustrates a memory array that may be implemented by exemplary embodiments of the present invention.

FIG. 2 illustrates a memory array 103 that may be implemented by exemplary embodiments of the present invention. The memory array 103 includes a number of memory locations 204, location addressing circuitry 206, and read/write control circuitry 208 that sends write signals to the memory locations 204 and performs read operations on the memory locations 204 selected by the location addressing circuitry 206. The read/write control circuitry 208 and the location addressing circuitry 206 are referred to collectively herein as "memory access control circuitry" 202.

Figure 3:
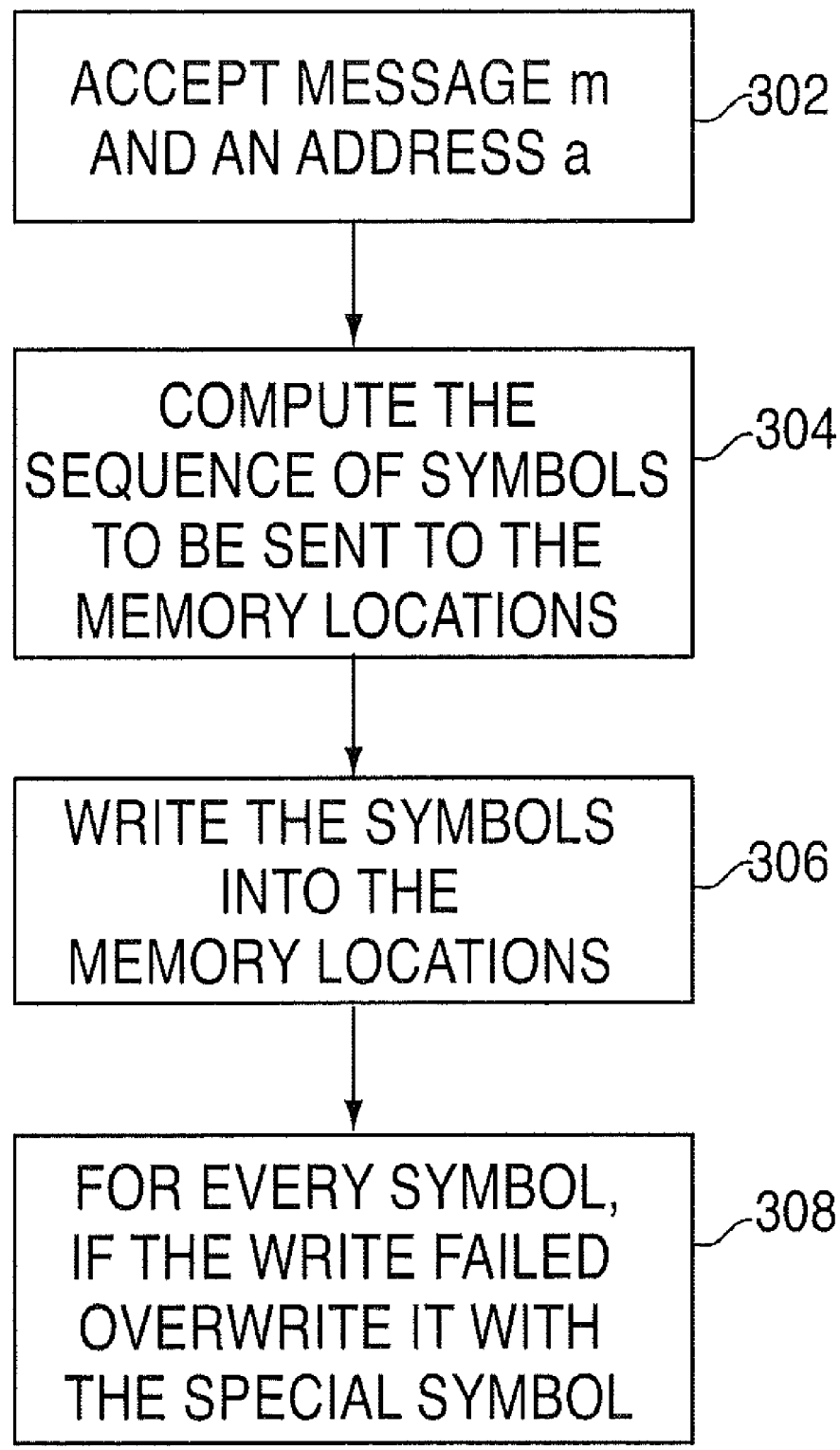
FIG. 3 illustrates a process for writing to a memory that may be implemented by exemplary embodiments of the present invention.

FIG. 3 illustrates a process for writing to a memory that may be implemented by exemplary embodiments of the present invention. At block 302, the memory controller 101 accepts a message, "m", to be encoded and written to the memory and a corresponding address, "a", that identifies the memory locations that will be used to store the encoded message. As used herein, the term "desired content" refers to any data to be written to a memory location, including a message, such as the message "m". At block 304, the message is encoded into a sequence of symbols suitable for memorization in the arrays 103 of memory locations. In exemplary embodiments, the encoding function corresponds to an ECC designed to deal with erasures. The ECC can process unknown symbols only, or with errors and erasures, meaning that the ECC can process both erasures in known positions and errors at unknown positions.

At block 306, the symbols are written into the memory location(s). First, the symbols are sent are sent to the arrays 103 through a data bus such as the write bus 104, and the address is specified to the arrays 103 through the address bus 102. The read/write control circuitry 208 initiates a write process (e.g., a write-and-verify process) to write the specified symbol into the corresponding memory location. At block 308, memory locations where the write failed (if any) are overwritten by the special symbol. If the write process for a memory location is unsuccessful (after a specified number of iterations) the symbol is overwritten by the special symbol. In exemplary embodiments of the present invention, the special symbol is a symbol that is not used by the code and which is likely to be written with a high degree of reliability on the first try.

In another exemplary embodiment, instead of writing the special symbol to the memory locations, the memory locations are marked as candidates for a special symbol. A special symbol is then written to all or a subset of the candidate memory locations based on, but not limited to, the following criterion. If the message is being protected with an error control code for which a decoder has been built that is capable of correcting up to "t" errors with unknown locations and up to "e" errors with known positions, the number of memory locations that are candidates for being overwritten with a special symbol are computed. If the number of candidate memory locations is equal or lesser than "e", then all the candidate locations may be overwritten with the special symbol. If the number of candidate memory locations is greater than "e", but the total number of candidate locations is less than "t+e" then any "e" candidate locations may be chosen and overwritten with the special symbol. In this case, the expectation is that the remaining number of errors can be resolved by the decoder which, in addition to being able to correct for "e" errors with known locations, can correct for up to "t" additional errors with unknown locations. Another technique for choosing which "e" symbols to overwrite is to select those candidate symbols whose contents are most distant from their desired contents. If the total number of candidate locations exceeds "t+e" then the error control at the decoder will not be able to resolve this error pattern and a retry of the write process may be requested.

In an exemplary embodiment of the present invention, block 302 is performed by the memory controller 101, and blocks 304-308 are performed by memory access control circuitry 202 in the array 103. In an alternate exemplary embodiment, blocks 302-304 are performed by the memory controller 101, and blocks 306-308 are performed by memory access control circuitry 202 in the array 103.

Figure 4:
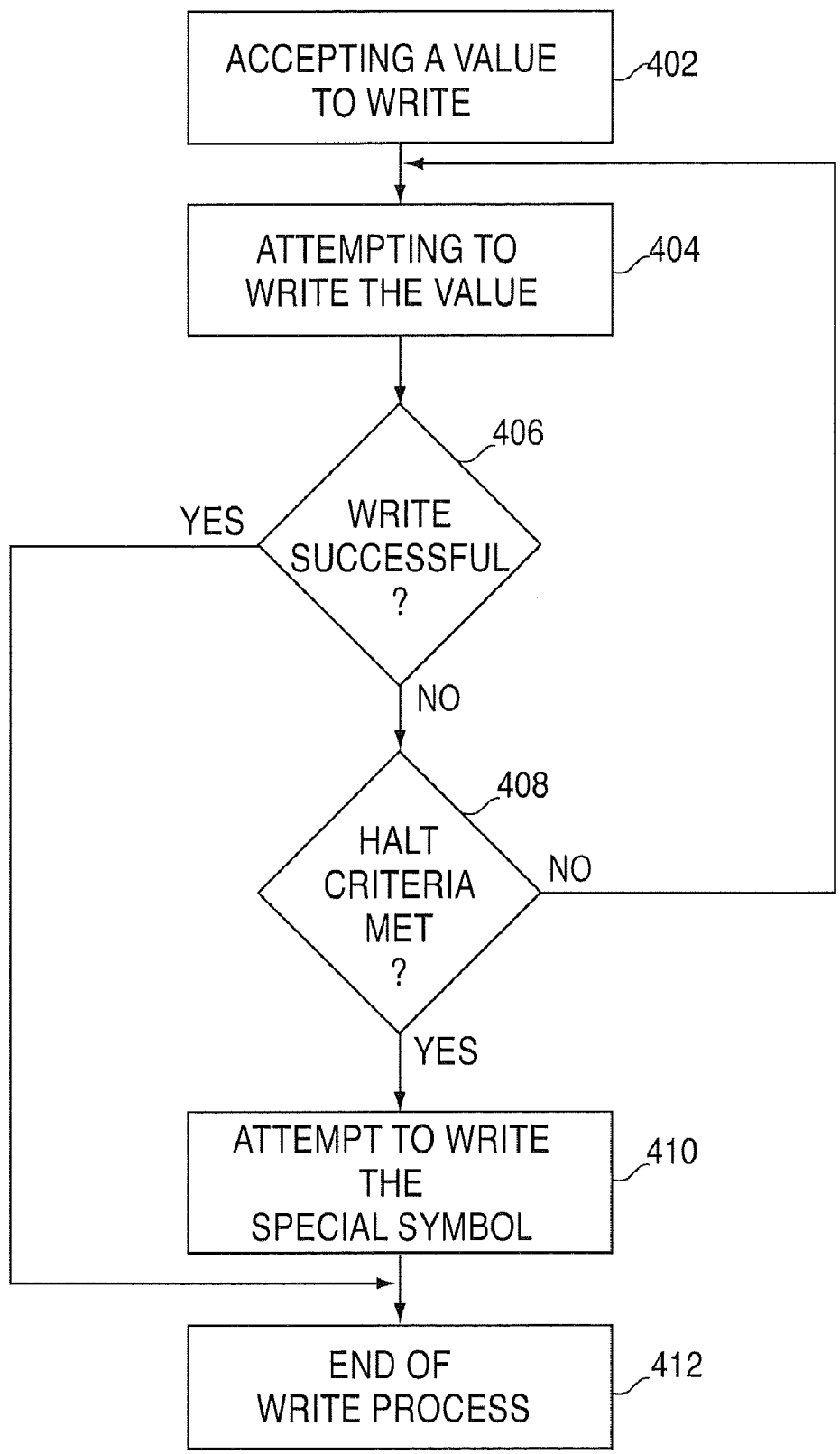
FIG. 4 illustrates a process flow for writing to a memory location that may be implemented by exemplary embodiments of the present invention.

FIG. 4 depicts a process for writing a symbol to a single memory location that may be implemented by the memory access control circuitry 202 in an exemplary embodiment of the present invention. At block 402, a value (also referred to herein as "desired content") to be written to a memory location is received at the memory access control circuitry 202. The value is converted (e.g., using an encoder) into a symbol to be placed into the memory location. At block 404 an attempt is made to write the symbol into the memory location. The write attempt includes a write followed by a read as part of an iteration in the iterative write process. At block 406, it is determined if the write has been successful, that is, if the read following the write returns the expected value (i.e., the symbol). If the write to the memory location is successful, then processing continues at block 412 where the write process ends. If the write to the memory location was not successful, as determined at block 406, then processing continues at block 408 where it is determined if a halt criteria (or halt condition) has been met. In exemplary embodiments, the halt criteria is met if a specified number of iterations of the write-read process has occurred and/or if a specified amount of time has elapsed since beginning the write process. If a halt criteria has been met, as determined at block 408, the processing continues at block 410 where a special symbol is written to the memory location. The memory access control circuitry 202 attempts to write the special symbol to the memory location; just as with other writes to the memory location there may be an error in the writing of the special symbol. In another exemplary embodiment of the present invention, instead of writing the special symbol to the memory location, the memory location is marked as a candidate for a special symbol and the special symbol may or may not be written to the memory location at a later time. Processing then continues at block 412 where the write process is halted. If, at block 406, it is determined that the write was not successful and then, at block 408, it is determined that the halt criteria has not been met, then processing continues at block 404 to perform another iteration in attempting to write the symbol to the memory location.

Figure 5:
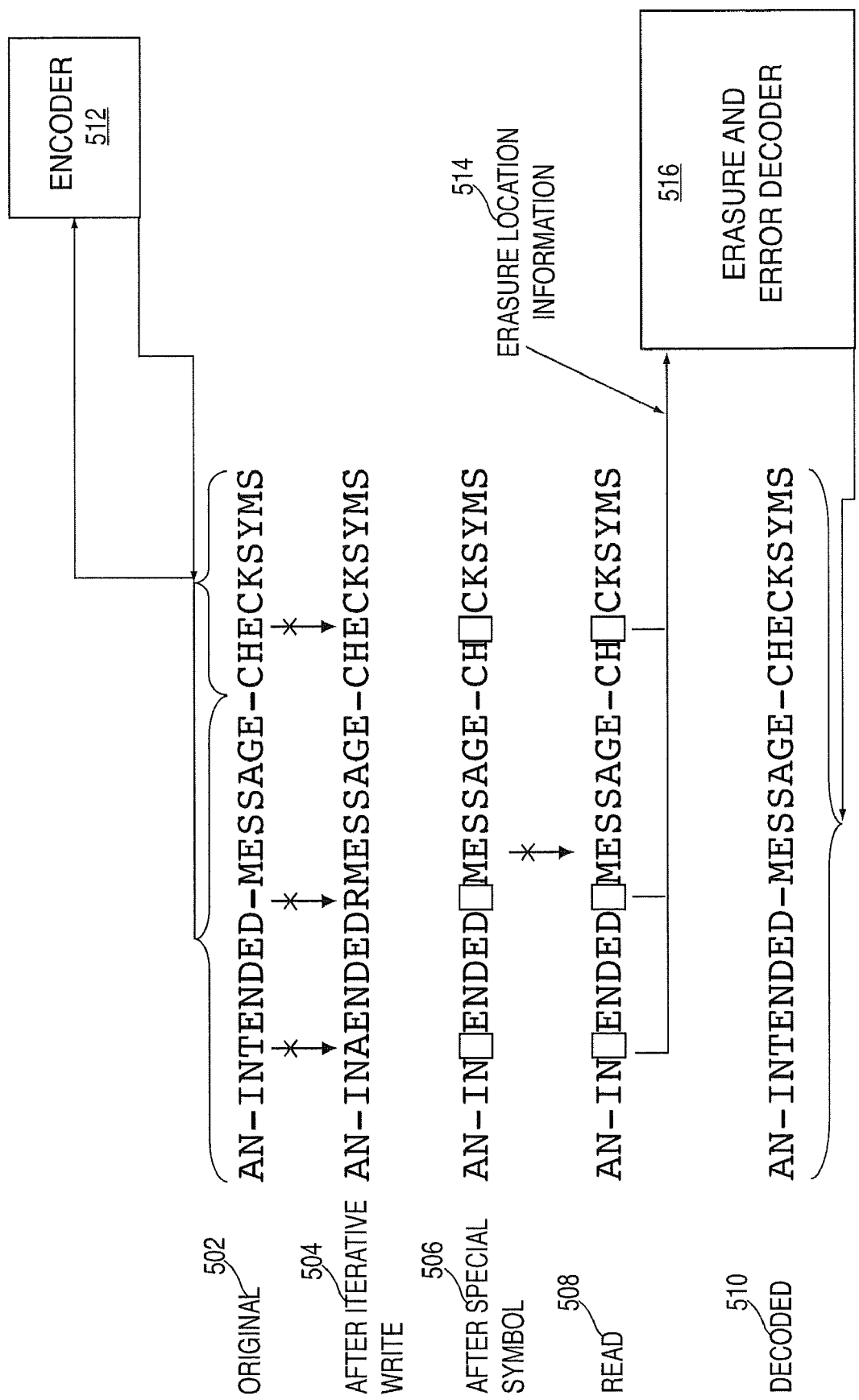
FIG. 5 illustrates a process flow for writing a message to memory that may be implemented by exemplary embodiments of the present invention.

FIG. 5 illustrates a process for writing a message to memory that may be implemented by exemplary embodiments of the present invention. In FIG. 5, an example operation is shown where the memory controller 101 is requested to store a given message, which is augmented by applying a code and then written into the memory locations. Erroneous locations are overwritten with the special symbol. Thus, when the memory controller 101 reads back the values, the presence of a special symbol indicates that the symbol should be disregarded and/or that there is complete uncertainty about the value of the symbol that should have been written. These special symbols can be treated as erasures by a decoding algorithm used by the code. An example code is a Reed-Solomon code that is used with a corresponding Reed-Solomon code decoder for erasures, or for errors and erasures, where the erasures may be indicated by the special symbol.

A message containing the symbols "AN-INTENDED-MESSAGE" is to be stored in a memory at several memory locations. The symbols are input to an encoder 512 which generates check symbols to be stored with the message. In exemplary embodiments, the encoder 512 is located in the memory access control circuitry 202; in other exemplary embodiments, the encoder 512 is located in a memory controller or memory module. The result of the encoding is an original encoded message 502 that includes symbols that represent the message along with check symbols. The iterative write process results in an iterative write message 504 before special symbols are inserted and an after special symbol message 506 after the special symbols are written.

The read message 508 is the results that are returned from a read command to the memory locations. In the exemplary embodiment depicted in FIG. 5, the read message 508 is input to an erasure and error decoder 516 to perform error correction on the read message 508. In this example, the read information has one additional error that was not caused due to the write errors (the E that has been converted into a U) In this example, the special symbols are treated as erasures by the decoder 516. The erasure location information 514 (e.g., the location of the special symbols) is input to the decoder so that these locations can be corrected. The result of the error correction is the decoded message 510. In exemplary embodiments, the decoder 516 is located in the memory access control circuitry 202, in other exemplary embodiments, the decoder 512 is located in a memory controller or memory module.

Figure 6:
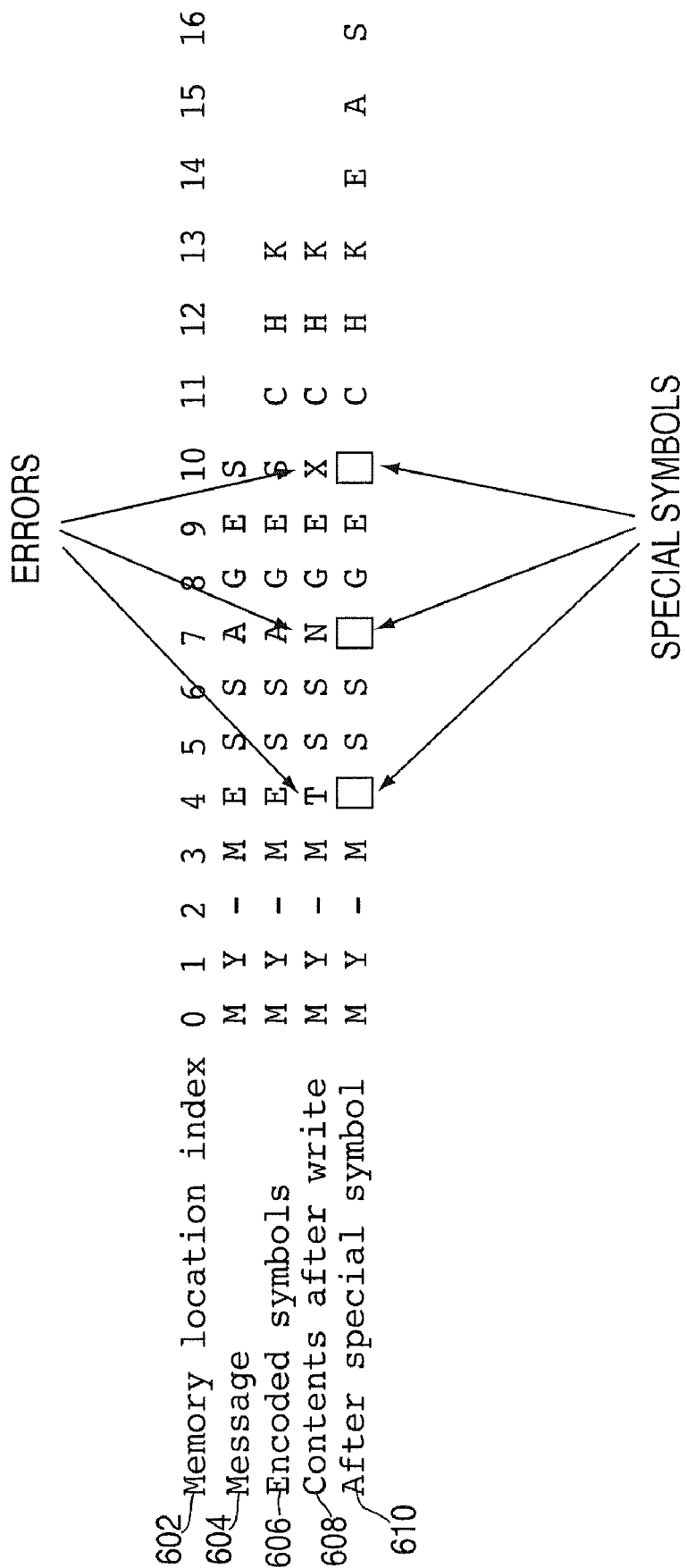
FIG. 6 illustrates a process for writing a message to memory that may be implemented by exemplary embodiments of the present invention.

FIG. 6 illustrates a process for writing a message to memory that may be implemented by exemplary embodiments of the present invention. The memory location index 602 depicted in FIG. 6 includes seventeen location indices for ease of description only, as any other number of location indices may be implemented by exemplary embodiments. A message 604 containing the data "MY-MESSAGES" is to be stored in the memory locations zero through ten. The message 604 is encoded, resulting in the encoded symbols 606 to be stored in memory locations zero through thirteen. In the embodiment depicted in FIG. 6, the encoded symbols 606 include check bits to be stored in memory locations eleven through thirteen. The contents after writing include errors in memory locations four, seven, and ten. This writing may be comprised of an iterative write procedure that may be stopped when a stopping condition is met. This iterative write procedure is comprised of a sequence of write-read operations in which the read is meant to verify the result of the write. Such stopping conditions include reaching maximum number of iterations, or the determination of successful writes, or the reaching of a maximum amount of time. In exemplary embodiments, the special symbol is inserted into these locations subsequent to the iterative write procedure and the write processing is completed. In other exemplary embodiments, such as the one depicted in FIG. 6, when an error is detected, an attempt is made to store the correct values in alternative memory locations fourteen through sixteen. Three alternative locations are depicted in FIG. 6, however any number of alternative locations may be implemented by exemplary embodiments to recover original symbols written to the memory locations. In the case depicted in FIG. 6, storing in the alternative locations corrects all of the errors and does not require any further error correction to be performed. In other cases, not all of the errors are corrected by writing to the alternative location, leaving one or more errors to be corrected by ECC.

If at the end of all write processes of all symbols obtained applying the encoding function, the number of locations that have been rewritten with the special symbol is greater than a given number (e.g., the maximum number of correctable erasures for the used code) the memory controller 101 might decide to reissue the complete write process or part of it, meaning rewriting a subset of the memory locations. This subset could comprise some or all of the memory locations containing a special symbol.

In exemplary embodiments of the present invention, the system has the option of performing a read of the memory locations involved in the storing operation and checking whether they contain a special symbol. The presence of a special symbol in a memory location or in a subset of the memory locations may be passed to the memory controller 101. As discussed previously, the memory controller 101 can use this information an input to an error control code decoding function, where the memory locations that are interpreted to have the special symbol are fed as erasure locations to an error control code. Additionally, the memory controller 101 can use this information as input to the encoding function or to change the sequence of the commands issued to the arrays of memory locations. For example, if a memory location contains a special symbol, the memory controller 101 could avoid sending a write command to that particular memory location. However, the presence of a special symbol does not necessarily imply that the memory location, or memory cell, is defective. For example, if one or more additional write iterations had been performed, the memory location might contain the write symbol and not the special symbol.

The presence of a special symbol in a memory location can also be used internally by the array of memory locations to change the method used to write in the memory location, without intervention of the memory controller 101. For example, the presence of a special symbol could imply that more time or more power is allocated for the write operation of the memory location (this because, depending on the adopted technology, the presence of a special symbol means that the memory location might require special treatment).

In the case of PCM, the content of a memory location might be the resistance value of the corresponding memory cell. The values that can be stored are analog, meaning that the resistance value could take a value among a continuum of possible values. In this case, the special symbol might be defined as any resistance values beyond a given threshold value. For instance, in a PCM cell any resistance values greater than a given value might signify that a special symbol has been written. One way to obtain a high resistance value in PCM is to "reset" a cell, which is achieved by sending through the cell an electrical pulse that is high enough to melt the cell and then remove the electrical pulse quickly enough so that the cell is left in an amorphous state.

Whenever other parameters, such as time before a certain event (for example the crossing epoch of a threshold for a voltage signal), are used to characterize the contents of a memory location, any time above a given value or any time below a given value can be used and interpreted as a special symbol.

Rewriting the memory locations with a special symbol when the write operation fails allows the use of feedback codes for erasure channels in rewritable memories. An exemplary embodiment includes a memory system having a memory controller, such as the memory controller 101, and several arrays of memory locations (e.g., arrays 103) connected to the memory controller through one or more control buses, data buses, and address buses. In this embodiment, each array includes read/write control circuitry 208 that implements the proposed method, in that, if the operation of writing a specified symbol into a specified memory location fails, the memory location is overwritten with the special symbol.

In an exemplary embodiment, encoding and writing are implemented as follows: (1) set an index $i_m$ equal to zero for the current memory location; (2) set an index i equal to zero for the current symbol; (3) write the $i_s$-th symbol to the $i_m$-th memory location; (4) if a special symbol was not written increment $i_s$; (5) increment $i_m$; (6) if $i_s$ equal to the number of symbols to be written or if $i_m$ is equal to the number of memory locations corresponding to the specified address then stop, otherwise go to (3). This is an example of one process for encoding and writing, other processes may also be implemented by exemplary embodiments.

An exemplary process for decoding and reading back the message follows: (1) set an index $i_m$ equal to zero for the current memory location; (2) set an index $i_s$ equal to zero for the current symbol; (3) read the contents of the $i_m$-th memory location; (4) if a special symbol was not read, append the read symbol to the sequence of read symbols; (5) increment $i_s$; (6) increment $i_m$; (7) if the number of read symbols $i_s$ is equal to the number of symbols in an encoded sequence, stop and apply the decoding function to the sequence of read symbols otherwise go to (3). This is an example of one process for decoding and reading, other processes may also be implemented by exemplary embodiments.

In an exemplary embodiment of the present invention, the special symbol is be used for purposes other than to denote a failed write operation. For example, the memory controller can issue the write of special symbols in particular memory locations. The position and the number of special symbols can be used to store information regarding the number of uses of the memory locations. The special symbol can be used as a pilot symbol for acquiring the statistical properties or the describing parameter of a model of the memory locations. This makes it possible to deal with temporal drift of the parameters characterizing the memory locations. For example in phase change memory there exists a phenomenon called level drift in which resistance values after written increase their value. The amount of increase is proportional to the amount of time elapsed since they were written. The amount of drift in a group of memory locations may be deduced by measuring the amount of drift that memory locations written with special symbols have incurred. This is possible because there exists correlations between the drift across multiple memory locations that have been written at approximately the same time. In exemplary embodiments, a special write signal resulting in a particular write signal is used to purposely denote a damaged memory location. In certain cases it is acceptable that the application of the special signal leading to the memorization of the special symbol into the memory location leads to an irreversible change in the memory location, meaning that it modifies the behavior of the memory location when accessed for writing its contents for a long period. An example of this is a destructive signal that permanently modifies the internal structure of the memory location.

Exemplary embodiments of the present invention include a method for reading to a memory with memory cells. The method includes retrieving the contents of at least two memory cells, and determining which of the at least two memory cells is likely to be associated with a special symbol. The contents of the at least two memory cells together with the location of the special symbols are communicated to a decoder which may be located within a memory device containing the memory array, or may be located in a memory controller placed in a physically separate location. In exemplary embodiments, the decoder uses the location of the special symbols to determine the location of erasures in an ECC (e.g., a Reed-Solomon code). In exemplary embodiments, where the contents of the memory cells may have aged, the decoder uses the contents of the cells associated with the special symbols to estimate the magnitude of the aging. In addition, the decoder may recover the original data written to the memory by computing error magnitude at the locations of the special symbols as well as the error magnitude and locations of additional errors. This is accomplished by the use of an error control code that is capable of decoding erasures as well as errors with unknown locations. Codes and the associated decoders with this property are well known in the art; for example Reed-Solomon codes have this property and efficient encoders and decoders are known in the art. The locations of special symbols are fed as erasures to an erasure decoder which recovers the errors (error magnitude) at the locations where a special symbol has been read. Optionally, the decoder detects and decodes additional errors that may have taken place during writing time and/or subsequent to writing time. In exemplary embodiments the special symbols are located (or detected) by determining whether the resistance of a cell is higher than a threshold.

Exemplary embodiments of the present invention include a method for writing to a rewritable memory location. The method (e.g., performed by a memory subsystem or memory device) includes accepting a desired content to be written into the memory location. The content is then written into the memory location. The success of the write operation is verified. In case that the write operation was unsuccessful, this process may be repeated again or if a stopping criterion is met, such as reaching maximum number of iterations, in the case that the overall iterative write operation was unsuccessful, a special symbol is written to the memory location. In exemplary embodiments, the memory subsystem or device accepts a message to be written into the memory and a corresponding address. The message is encoded into a plurality of symbols each to be written in a memory location as described previously. In exemplary embodiments, the message is encoded into a plurality of symbols using error and erasure correcting codes. In exemplary embodiments, the read operation is performed using a corresponding error and erasure correcting code decoder that treats the special symbols as erasures. In exemplary embodiments, the memory subsystem or memory device accepts a message to be written into the memory and a corresponding address. The message is encoded into a plurality of symbols using an erasure feedback channel code. The symbols are then written in sequentially and fed back to the erasure feedback code. The special symbols are treated as erasures. In exemplary embodiments, some of the special symbol codes may be utilized to identify cells that are temporarily or permanently dead (unusable), and cells that have been reserved for the purpose of not being written on to for various purposes such as wear-leveling or interference mitigation. In exemplary embodiments, the process of writing all or a subset of the special symbols is irreversible.

Exemplary embodiments include a method for writing to a memory. The method includes accepting a message to be encoded in the memory. The content of the memory locations where the message is to be stored is read to find the positions of special symbols written into them. A plurality of symbols are generated based on the message to be encoded and on the positions of the previously present special symbols. The generated symbols are stored in the memory with a method that depends on the positions of the previously present special symbols. In exemplary embodiments, after the symbols are stored, part of the memory locations are rewritten with special symbols based on the message to be stored, on the stored values, and on the positions of the previously present special symbols.

Technical effects and benefits include the ability to insert a special symbol into a memory location during a write process to indicate the absence of a data symbol in the memory location. The special symbol aids in the proper reading and decoding of the symbols stored in the memory. In one example, the special symbol is utilized by an ECC process for performing error detection and correction.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, the present invention may be embodied as a system, method, or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium. Any combination of one or more computer-usable or computer-readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 7:
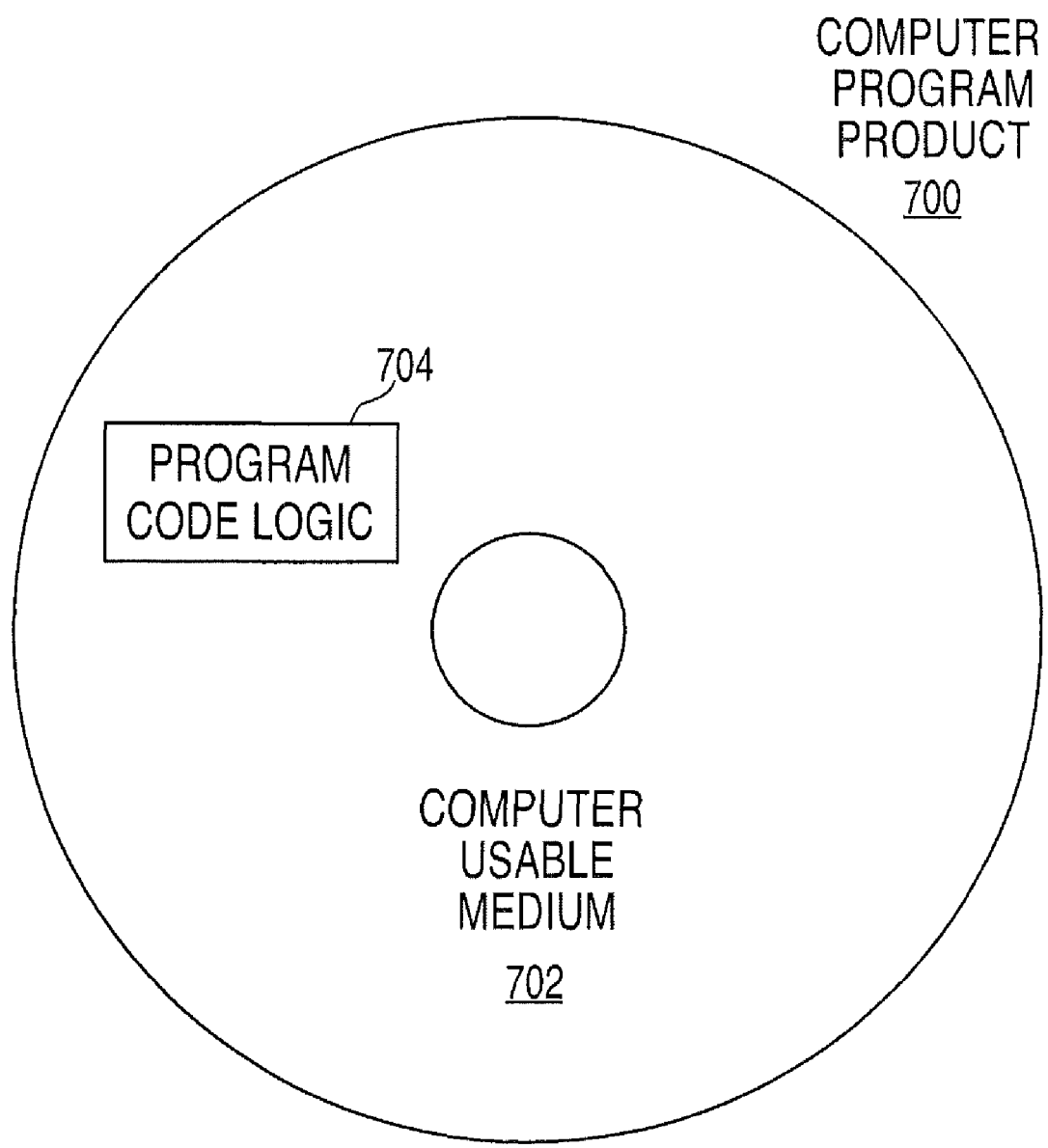
FIG. 7 depicts a computer program product that may be implemented by an exemplary embodiment of the invention.

As described above, embodiments can be embodied in the form of computer-implemented processes and apparatuses for practicing those processes. In exemplary embodiments, the invention is embodied in computer program code executed by one or more network elements. Embodiments include a computer program product 700 as depicted in FIG. 7 on a computer usable medium 702 with computer program code logic 704 containing instructions embodied in tangible media as an article of manufacture. Exemplary articles of manufacture for computer usable medium 702 may include floppy diskettes, CD-ROMs, hard drives, universal serial bus (USB) flash drives, or any other computer-readable storage medium, wherein, when the computer program code logic 704 is loaded into and executed by a computer, the computer becomes an apparatus for practicing the invention. Embodiments include computer program code logic 704, for example, whether stored in a storage medium, loaded into and/or executed by a computer, or transmitted over some transmission medium, such as over electrical wiring or cabling, through fiber optics, or via electromagnetic radiation, wherein, when the computer program code logic 704 is loaded into and executed by a computer, the computer becomes an apparatus for practicing the invention. When implemented on a general-purpose microprocessor, the computer program code logic 704 segments configure the microprocessor to create specific logic circuits.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for writing in a memory system, the method comprising:

receiving an address corresponding to a memory location in a memory;

receiving a desired content to be written to the memory location;

encoding the desired content into a symbol to be written to the memory location;

writing the symbol to the memory location using an iterative write process of at least one write and one read to the memory location, the iterative write process including:

determining if the symbol was successfully written to the memory location;
exiting the iterative write process in response to the symbol being successfully written to the memory location;
determining if a halt condition has been met; and
exiting the iterative write process if the halt condition has been met; and
identifying the memory location as a candidate for being written with a special symbol in response to the symbol not being successfully written to the memory location.

2. The method of claim 1, wherein the special symbol is written to the memory location in response to the memory location being identified as a candidate for being written with the special symbol.

3. The method of claim 1, wherein the halt condition includes one or more of a specified maximum number of iterations being reached, and a specified maximum amount of time for writing the symbol to the memory location elapsing.

4. The method of claim 1, wherein the memory is capable of storing analog values, distinct symbols are associated with distinct analog values, and a symbol is not written successfully if the stored analog value differs from a desired analog value by more than a threshold.

5. The method of claim 1, wherein the memory is a phase change memory (PCM), the symbol is stored in a PCM cell, and the special symbol is associated with a high resistance state for the PCM cell.

6. The method of claim 1, wherein the desired content is a message that spans a plurality of memory locations, wherein the encoding and writing the symbol are performed for each memory location and at least one of the memory locations has been identified as a candidate for the special symbol, and the method further comprises writing the special symbol to one or more of the memory locations identified as candidates for the special symbol.

7. The method of claim 6, further comprising reading the memory locations and determining a location of erasures in an error control code associated with the message in response to detecting the one or more special symbols.

8. The method of claim 6, further comprising reading the memory locations and estimating a magnitude of aging of contents of one or more of the memory locations in response to detecting the one or more special symbols.

9. The method of claim 6, further comprising reading the memory locations and recovering the desired content in response to detecting the one or more special symbols.

10. The method of claim 6 wherein at least one of the memory locations contains an error control code (ECC) bit.

11. A memory system comprising:
a memory including a memory location; and
memory access control circuitry connected to the memory location, the memory access control circuitry:
receiving an address corresponding to the memory location via an address bus;
receiving a desired content to be written to the memory location via a write bus;
encoding the desired content into a symbol to be written to the memory location;
writing the symbol to the memory location using an iterative write process of at least one write and one read to the memory location, the iterative write process including:
determining if the symbol was successfully written to the memory location;
exiting the iterative write process in response to the symbol being successfully written to the memory location;
determining if a halt condition has been met; and
exiting the iterative write process if the halt condition has been met; and
identifying the memory location as a candidate for being written with a special symbol in response to the symbol not being successfully written to the memory location.

12. The system of claim 11, wherein the special symbol is written to the memory location in response to the memory location being identified as a candidate for being written with the special symbol.

13. The system of claim 11, wherein the halt condition includes one or more of a specified maximum number of iterations being reached, and a specified maximum amount of time for writing the symbol to the memory location elapsing.

14. The system of claim 11, wherein the memory is capable of storing analog values, distinct symbols are associated with distinct analog values, and a symbol is not written successfully if the stored analog value differs from a desired analog value by more than a threshold.

15. The system of claim 11, wherein the memory is a PCM, the symbol is stored in a PCM cell, and the special symbol is associated with a high resistance state for the PCM cell.

16. The system of claim 11 wherein the desired content is a message that spans a plurality of memory locations in the memory, wherein the encoding and writing the symbol are performed for each memory location and at least one of the memory locations has been identified as a candidate for the special symbol, and the memory access control circuitry further writes the special symbol to one or more of the memory locations identified as candidates for the special symbol, reads the memory locations, and performs one or more of determining a location of erasures in an error control code associated with the message in response to detecting the one or more special symbols, estimating a magnitude of aging of contents of one or more of the memory locations in response to detecting the one or more special symbols; and recovering the desired content in response to in response to detecting the one or more special symbols.

17. A computer program product for writing in a memory system, the computer program product comprising:
a tangible storage medium readable by a processing circuit and storing instructions for execution by the processing circuit for performing a method comprising:
receiving an address corresponding to a memory location in a memory;
receiving a desired content to be written to the memory location;
encoding the desired content into a symbol to be written to the memory location;
writing the symbol to the memory location using an iterative write process of at least one write and one read to the memory location, the iterative write process including:
determining if the symbol was successfully written to the memory location;
exiting the iterative write process in response to the symbol being successfully written to the memory location;
determining if a halt condition has been met; and
exiting the iterative write process if the halt condition has been met; and
identifying the memory location as a candidate for being written with a special symbol in response to the symbol not being successfully written to the memory location.

18. The computer program product of claim 17, wherein the special symbol is written to the memory location in response to the memory location being identified as a candidate for being written with the special symbol.

19. The computer program product of claim 17, wherein the halt condition includes one or more of a specified maximum number of iterations being reached, and a specified maximum amount of time for writing the symbol to the memory location elapsing.

20. The computer program product of claim 17, wherein the desired content is a message that spans a plurality of memory locations in the memory, wherein the encoding and writing the symbol are performed for each memory location and at least one of the memory locations has been identified as a candidate for the special symbol, and the method further comprises writing the special symbol to one or more of the memory locations identified as candidates for the special symbol, reading the memory locations, and performing one or more of determining a location of erasures in an error control code associated with the message in response to detecting the one or more special symbols, estimating a magnitude of aging of contents of one or more of the memory locations in response to detecting the one or more special symbols; and recovering the desired content in response to in response to detecting the one or more special symbols.

* * * * *